United States Patent
Huang et al.

(10) Patent No.: US 8,339,884 B2
(45) Date of Patent: Dec. 25, 2012

(54) LOW POWER AND HIGH SPEED SENSE AMPLIFIER

(75) Inventors: Yi-Cheng Huang, Hsinchu (TW); Shang-Hsuan Liu, Zhudong (TW); Yuan-Long Siao, Luzhu (TW)

(73) Assignee: Taiwan Semiconductor Manufacturing Company, Inc., Hsin-Chu (TW)

( * ) Notice: Subject to any disclaimer, the term of this patent is extended or adjusted under 35 U.S.C. 154(b) by 169 days.

(21) Appl. No.: 13/006,487

(22) Filed: Jan. 14, 2011

(65) Prior Publication Data

US 2012/0182818 A1    Jul. 19, 2012

(51) Int. Cl.
*G11C 7/00* (2006.01)
(52) U.S. Cl. ............... 365/203; 365/205; 365/185.25
(58) Field of Classification Search .................. 365/203, 365/205, 185.25
See application file for complete search history.

(56) References Cited

U.S. PATENT DOCUMENTS

| | | | |
|---|---|---|---|
| 6,411,550 B1 | 6/2002 | Nasu | |
| 6,819,612 B1* | 11/2004 | Achter | 365/205 |
| 7,057,957 B2 | 6/2006 | Wang | |
| 7,495,961 B2 | 2/2009 | Cho et al. | |
| 7,729,187 B2 | 6/2010 | Kim | |
| 2003/0155948 A1* | 8/2003 | Chung et al. | 327/51 |
| 2005/0213406 A1* | 9/2005 | Wang | 365/207 |
| 2006/0120175 A1* | 6/2006 | Chou et al. | 365/189.06 |
| 2009/0016131 A1* | 1/2009 | Lee et al. | 365/203 |

* cited by examiner

*Primary Examiner* — Tuan T. Nguyen
(74) *Attorney, Agent, or Firm* — Duane Morris LLP; Joseph A. Powers (57) ABSTRACT

A sense amplifier circuit includes a precharge circuit configured to precharge a bit line coupled to a sensing node in response to a precharge control signal and a sense output circuit. The sense output circuit includes a sense output inverter coupled to the sensing node. The sense output inverter is disabled during bit line precharging and for a period after bit line precharging is complete, and thereafter the sense output inverter is enabled.

20 Claims, 6 Drawing Sheets

LOW POWER AND HIGH SPEED SENSE AMPLIFIER

TECHNICAL FIELD

The present disclosure relates to memory circuits, and more specifically to sense amplifiers used in memory circuits.

BACKGROUND OF THE INVENTION

A typical non-volatile memory system, such as flash memory, contains several subsystem circuits which make up the whole memory system. For example, there is the address decode subsystem which takes the memory address bus as input and outputs word lines which select groups of memory cells for writing and reading. In addition, there are input data drivers that interface with the memory array data bit lines for purposes of writing new data into the memory cells. And there are the memory arrays themselves which are made up of memory cells.

For purposes of reading previously stored data out of the memory cells, there is a sense amplifier subsystem. This subsystem senses the data level of bit lines in order to report or read the value of memory cells. The sense amplifier circuitry interfaces with bit lines which are attached to the memory cells and with data output drivers which are the output lines of the memory system.

The power dissipation and speed of sense amplifiers are important design issues, since any improvement to power consumed by sense amplifiers and in the speed of sense amplifiers are magnified several times due to the widespread use of dynamic random access memory.

With prior art sense amplifiers, the voltage at the bit line is precharged to a value that is close to the trigger point of the sense inverter of the sense amplifier (i.e., half way between VDD and VSS). The precharge reduces the bit line charging time and improves read speed. The precharge reduces the bit line charging time and improves read speed. When the input voltage of the inverter is close to the trigger point, the inverter consumes a large "crowbar" current and the output of the inverter does not respond to the input of the data. This consumed power is wasted.

There is also a delay time in the signal between the bit line precharge path and the sense inverter. This leads to overcharges in the precharge level since it takes time to pull the bit line down to the desired sense level, which increases the data access time. That is, larger overcharges lead to longer access times. This situation is illustrated in the timing diagram of FIG. 1 discussed below.

Figure 1:
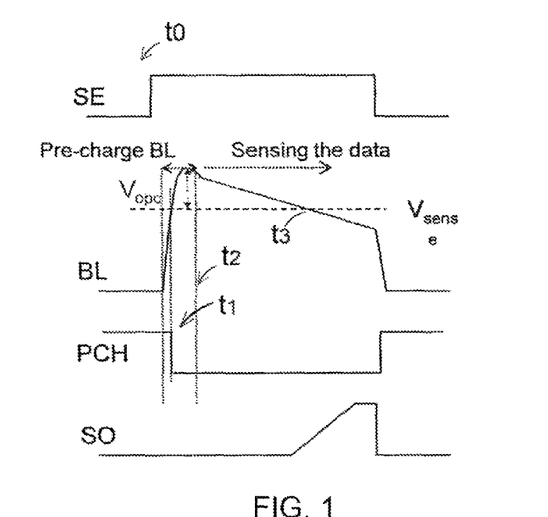
FIG. 1 is a timing diagram illustrating the operation of a prior art sense operation.

Signal SE is a sense enable control signal. Signal BL represents the bit line voltage. Signal PCH is a bit line precharge control signal. Signal SO is the sense output signal of the sense amplifier. As shown in FIG. 1, when both SE and PCH are high at time t0, bit line charging begins. When the bit line voltage reaches the sense voltage (Vsense) at time t1, PCH goes low. However, the bit line continues to charge for a period after PCH goes low (i.e., until time t2), leading to an overcharge voltage Vopc. Assuming a data "1" state, it takes until time t3 for the bit line voltage to decay to the sense voltage Vsense, at which time the data state (as illustrated by sense output SO) can be detected. The delay between time t1 and t3 increases the data access time.

Finally, the bit line precharge may result in the wrong determination of the bit line precharge level because the charge sharing with the bit line cannot respond as fast as the rising of the voltage on the sensing node. Data errors may occur when attempting to read a "0" out of a memory cell. More specifically, in the case of a long bit line, the capacitance of bit line is large. The bit line cannot respond as fast as the rising of the voltage on the sensing node. The sensing node will reach the precharging level but the bit line has not when the precharging path is turned off. The voltage of the sensing node will then be pulled down to the bit line voltage $V_{BL}$ because of charge sharing, which is lower than the sensing voltage. If the memory cell is weakly-programmed, the cell current is slightly lower than the reference current. The bit line voltage may still be lower than the sensing voltage after the reference sense amplifier is ready. In this case, a read "0" fail occurs.

Improvements in memory cells systems are desired.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. Terms concerning electrical attachments, coupling and the like, such as "connected" and "interconnected," refer to a relationship wherein structures communicate with one another either directly or indirectly through intervening structures, unless expressly described otherwise.

A sense amplifier architecture is disclosed herein that, in embodiments, can reduce the power consumed during the period of data development. The architecture also provides a well-controlled bit line voltage which improves data access time. In embodiments, in order to reduce the consumed power, a switch is added into the sensing inverter and only turned on when it is assumed that the sensing input will be far lower than the sensing threshold (in the case of reading an erased cell). To avoid the over-precharge problem discussed above, and errors in determining the bit line precharge level, a keeper circuit can be added along with an additional inverter (i.e., inverter 132 in FIG. 3) whose threshold voltage is slightly lower than that of the data sensing inverter. These and other features of various embodiments are described below and in the figures.

Figure 2:
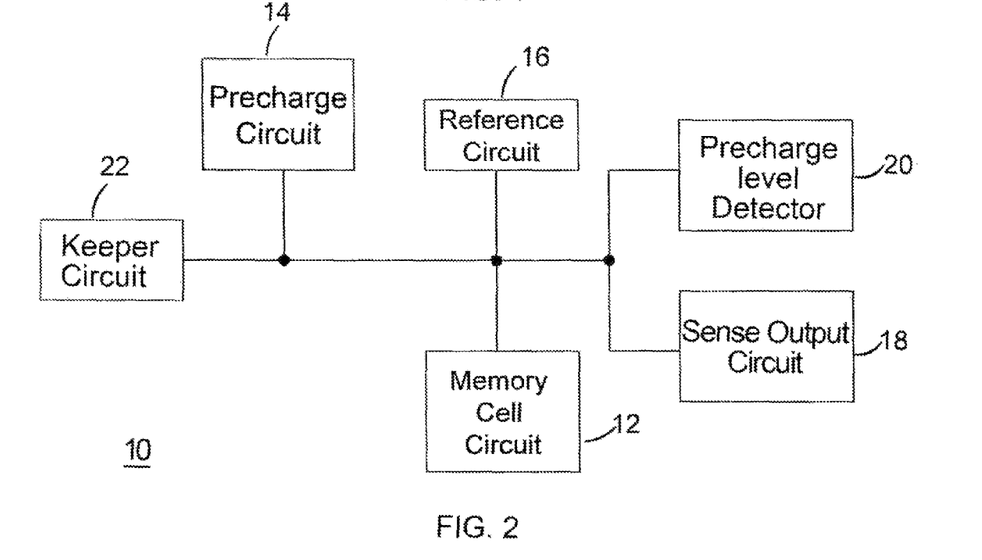
FIG. 2 is a block diagram of an embodiment of a memory circuit having a sense amplifier.

FIG. 2 is a block diagram of a memory circuit 10. The memory circuit 10 includes a memory cell circuit 12, e.g., a non-volatile memory cell circuit containing flash or other memory cells, and a sense amplifier circuit containing a precharge circuit 14, a reference circuit 16, a sense output circuit 18, a precharge level detector 20 and a keeper circuit 22. In comparison to prior art sense amplifier architectures, the keeper circuit 22 has been added, the precharge level detector operation (via the precharge level detector 20) is separated from the sense output, and the sense output circuit 18 is modified to improve power savings.

Figure 3:
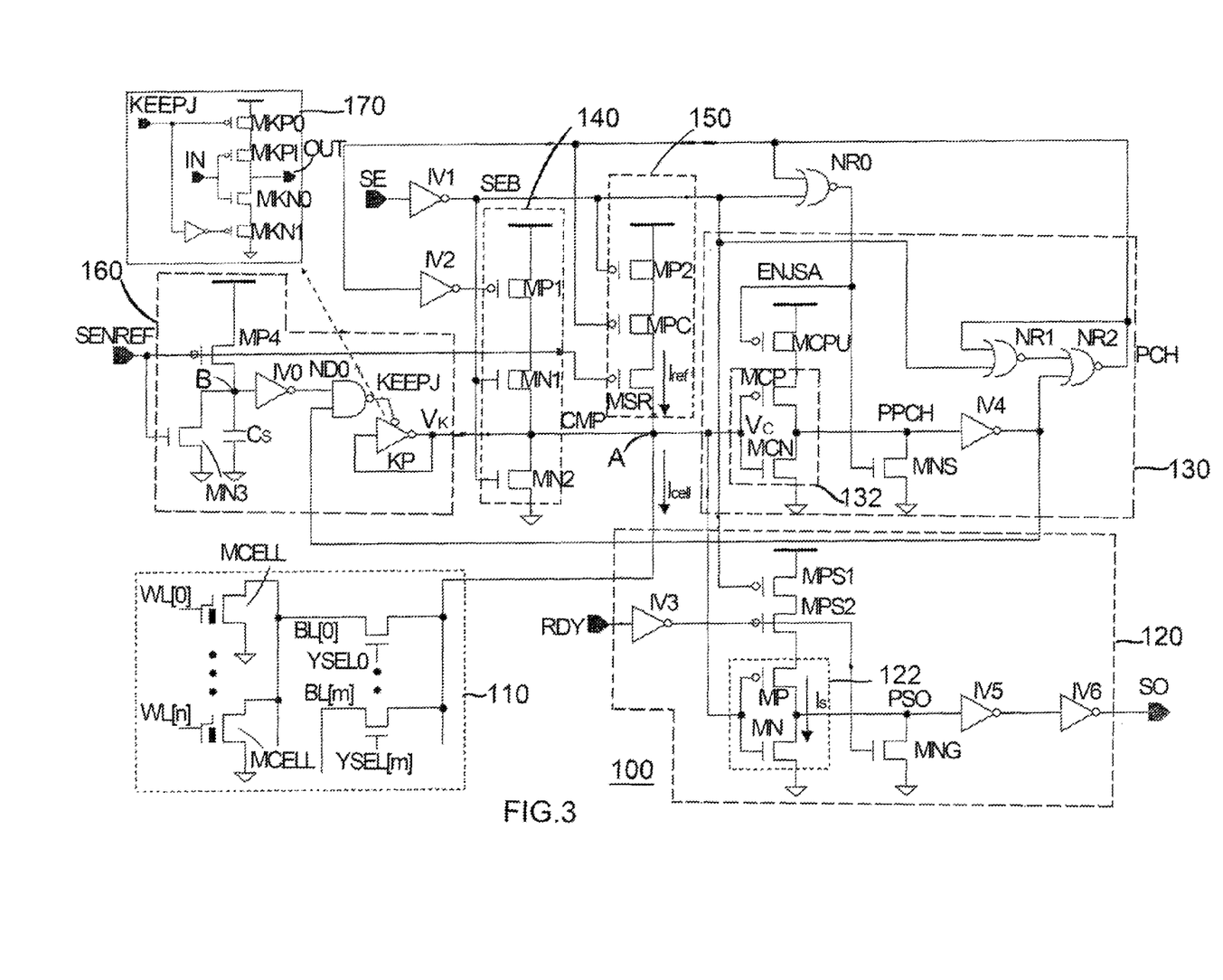
FIG. 3 is a circuit diagram of an embodiment of memory circuit having a sense amplifier.

FIG. 3 illustrates an embodiment of a memory circuit 100. Memory circuit 100 includes a conventional memory cell circuit 110. As will be understood by those familiar with memory architectures, the memory cell circuit 100 includes a plurality of rows and columns of memory cells addressed via word line address control signals WL[0:n] and column select control signals YSEL[0:m] for bit lines BL[0:m]. A logic '1' (i.e., erased cell) or a logic '0' is stored in each memory cell MCELL.

The memory circuit 100 includes a reference circuit 150 for providing a reference current $I_{ref}$ to a sensing node A. The reference circuit 150 includes three cascaded transistors coupled between the high power supply node and sense node A. Specifically, the reference circuit 150 includes PMOS transistors labeled MP2, MPC and MSR. The gate of PMOS MP2 is coupled to sense enable control signal SEB, which is the inverse of sense enable control signal SE. The gate of PMOS MPC is coupled to precharge control signal PCH, and the gate of PMOS MSR is coupled sense reference control signal SENREF, which is provided from a conventional reference current generator circuit (not shown in FIG. 3). As such, the reference circuit 150 generates the reference current $I_{ref}$ only when SEB is low (i.e., when SE is high) and PCH is low. It should be understood that $I_{ref}$ is a mirrored current, represented by SENREF, from the conventional reference current generator circuit.

The memory circuit 100 includes a sense output circuit 120 which, as is conventional, includes a sense inverter 122 that includes PMOS transistor MP and NMOS transistor MN having gate terminals coupled together to node A. The current through this sense inverter 122 is labeled as $I_s$. The output of the inverter 122 is labeled as signal PSO. Signal PSO is twice inverted by series connected inverters IV5 and IV6 to provide sense output signal SO.

Unlike conventional sense output circuits, the sense inverter 122 has a header formed from PMOS transistors MPS1 and MPS2. PMOS transistor MPS1 has its gate terminal coupled to signal SEB and PMOS transistor MPS2 has its gates terminal connected through inverter IV3 to control signal RDY. NMOS transistor MNG is also provided between the output node of the inverter 122 and the low power supply node (i.e., ground). The gate of MNG is also coupled to the control signal RDY through inverter IV3. Transistor MNG pulls signal PSO to ground to when signal RDY is low. Otherwise, PSO would be floating when inverter 122 is disabled, which would result in leakage current in inverter IV5.

The header configuration of MPS1 and MPS2 ensures that the sensing inverter 122 is off until signal RDY is asserted. During this time, no (or little) current flows through the sense inverter 122 (i.e., current $I_s$ is at or approximately 0 A). As is described in more detail below, signal RDY is provided from a reference sense amplifier, which always reads a strong erased cell, and corresponds to the sense output (SO) of that reference sense amplifier. The reference sense amplifier is almost identical to the sense amplifier 120 except that its sensing inverter 122 is not turned off during the sensing period. Since the cell bit connected to the reference sense amplifier is strongly-erased, the asserted RDY signal confirms that sufficient time has passed for any strongly-erased cells in main array to be readable. However, some cells in main array may be weakly-erased. These cell bits will need more time to be sensed and induce crowbar current in the conventional sense amplifier. Even though signal RDY does not represent the completeness of reading a weakly-erased cell, it is indicative of sufficient time having passed such that Vcmp, which is the voltage at the sense node, in the sense amplifier of the main array (i.e., the sense amplifier of memory circuit 100), connected to a weakly-erased cell will not be near the sense voltage Vs. That is, there is assurance that the Vcmp in the sense amplifier for reading an erased cell in the main memory is far lower than Vs. The crowbar current in the sensing inverter 122 can be minimized. After RDY is asserted, the sensing inverter is enabled and the data can be delivered rapidly.

The reference sense amplifier exists in conventional memory architectures. The purpose of the reference sense amplifier in those conventional architectures is to generate a signal (RDY) for use in controlling the latching of the main sense amplifier outputs via the output buffer flip-flops. However, the actual value of the erased cell current is a distribution due to degradation from repeated programming. The RDY signal needs to be delayed to cover this distribution, even in the memory circuit disclosed herein. Embodiments disclosed herein extends the use of this readily available RDY control signal beyond controlling latching in the output buffer, for turning on the sense output circuit.

Memory circuit 100 also includes a precharge level detector circuit 130. The precharge level detector circuit 130 includes an inverter 132 including NMOS MCN and PMOS MCP. The input of the inverter (i.e., the gate terminals of MCN and MCP) is coupled to sensing node A to receive voltage Vc, which corresponds to the precharge voltage level, and the output of the inverter 132 is signal PPCH. PMOS switch MCPU is connected to inverter 132 and is responsive to control signal ENJSA. ENJSA is the output of NOR gate NR0, which has precharge control signal PCH and inverted sense enable signal SEB as inputs. Inverter 132 is on when ENJSA is low, which occurs as long as both PCH and SEB are not low (i.e., when PCH or SEB is high). Basically, inverter 132 is turned off when signal PCH goes low, since SEB is low for the entire sense enable period (i.e., when SE is high). The precharge level detector 130 also includes NMOS MN5, inverter IV4 and NOR gates NR1 and NR2. Transistor MN5 pulls PPCH to ground when precharging of the bit line is complete. ENJSA is high after the bit line is precharged. Otherwise, PPCH would be floating because inverter 132 is disabled, which would result in leakage current in inverter IV4 when ENJSA is high. One input of NOR gate NR1 is coupled to control signal SEB and the other is coupled to signal PCH. NOR gate NR2 has its first input coupled to the output of gate NR1 and its second input coupled to the output of IV4.

The trigger threshold of inverter 132 is voltage Vc, which is set to be lower than the trigger voltage Vs of inverter 122 of the sense inverter 122 of the sense output circuit 120. This ensures that the precharge level detector circuit 130 turns the precharge circuit 140 (discussed below) off before the bit line is charged to the sense voltage Vs level.

As shown in FIG. 3, memory circuit 100 also includes precharge circuit 140, which includes cascaded NMOS transistors MN1 and MN2 and PMOS transistor MP1. Transistors MN1 and MN2 are controlled by control signal SEB and PMOS transistor MP1 is controlled by precharge signal PCH, which is inverted by inverter IV2. The source of NMOS MN1 is coupled to the drain of NMOS MN2 at node A. When SE is high, the precharge circuit 140 operates to charge node A when precharge control signal PCH is enabled (i.e., high).

Finally, the memory circuit 100 also includes keeper circuit 160 responsive to control signals SENREF and feedback control signal PCH. Keeper circuit 160 includes an inverter formed from PMOS transistor MP4 and NMOS transistor MN3. The input to this inverter (i.e., the gate terminals of MP4 and MN3) is coupled to signal SENREF. The output of this inverter is coupled to the input of inverter IV0 at node B. A capacitor Cs is coupled between node B and ground. The output of inverter IV0 is coupled to the first input of NAND gate ND0. The second input of the NAND gate ND0 is coupled via a feedback path to the output of the inverter 132 via inverter IV4. The NAND gate ND0 provides control signal KEEPJ to tri-state enabled inverter KP, which has its output connected via a feedback path to its input and its output also coupled to sense node A. FIG. 3 illustrates an embodiment of a tri-state enabled inverter 170. The inverter KP is operational when KEEPJ is low and off when KEEPJ is high. Inverter KP has a trigger point set at voltage Vk. Therefore, when operating, inverter KP provides voltage Vk at node A. As will be described below, voltages Vk, Vs and Vc are related as follows: Vk>Vs>Vc.

As is conventional, during a read operation for a flash memory the word line voltage for the main memory array and mini memory array (FIG. 5) must be boosted after all bit lines are precharged. The time for boosting the word line from VSS to the correct reading word line voltage is considerable. The control signal SENREF indicates that the word line read voltage is proper. There is a timing gap from the individual bit line pre-charged ready to SENREF generation. The keeper circuit 160 maintains the bit line voltage during this timing gap until SENREF is ready.

Figure 4:
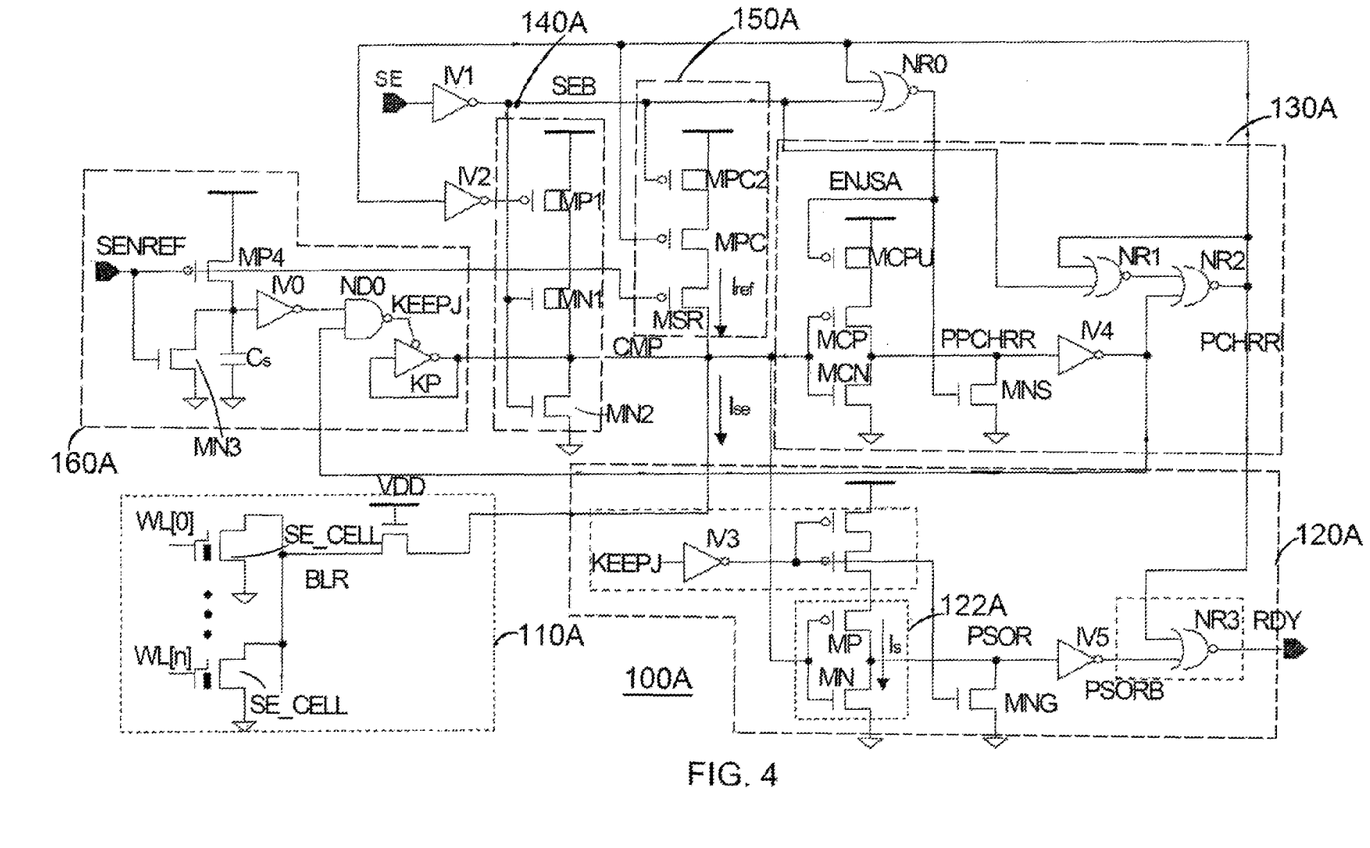
FIG. 4 is a circuit diagram of an embodiment of memory circuit having a reference sense amplifier.

FIG. 4 is a circuit diagram of a reference sense amplifier circuit 100A. The circuit 100A is designed to provide the control signal RDY shown in FIG. 3 for turning on the sense output circuit 120. The reference sense output circuit 100A is the same in many respects as the memory circuit 100 and includes memory cell circuit 110A, sense output circuit 120A (with inverter 122A), precharge level detector 130A, precharge circuit 140A, reference circuit 150A and keeper circuit 160A. However, each memory cell in memory circuit 110A is in a strongly-erased state. Therefore, sense current $I_{se}$ corresponds to the cell current of a strongly erased flashed cell. Current $I_{se}$ is larger than the normal cell current ($I_{cell}$) in a flash cell in memory cell circuit 110 of memory circuit 100. Other differences between circuit 100A and circuit 100 are found in the sense output circuit 120A. Each of header PMOS transistors MPS1 and MPS2 are controlled by the KEEPJ control signal via inverter IV3. That is, MPS1 and MPS2 are on only when KEEPJ is high. As such, the inverter 122A is operational only when KEEPJ is high. The output of inverter 122A is labeled as signal PSOR, which is inverted to provide signal PSORB via inverter IV5. NOR gate NR3 is provided in place of inverter IV6 (from memory circuit 100). The first input to NOR gate NR3 is signal PSORB and the second input to NOR gate NR3 is the precharge control signal PCHRR from precharge level detector circuit 130A. Signal RDY is enabled (i.e., high) when both PCHRR and PSORB are low, and is low otherwise. PSORB is low when the strongly-erased cell has been successfully read.

Figure 5:
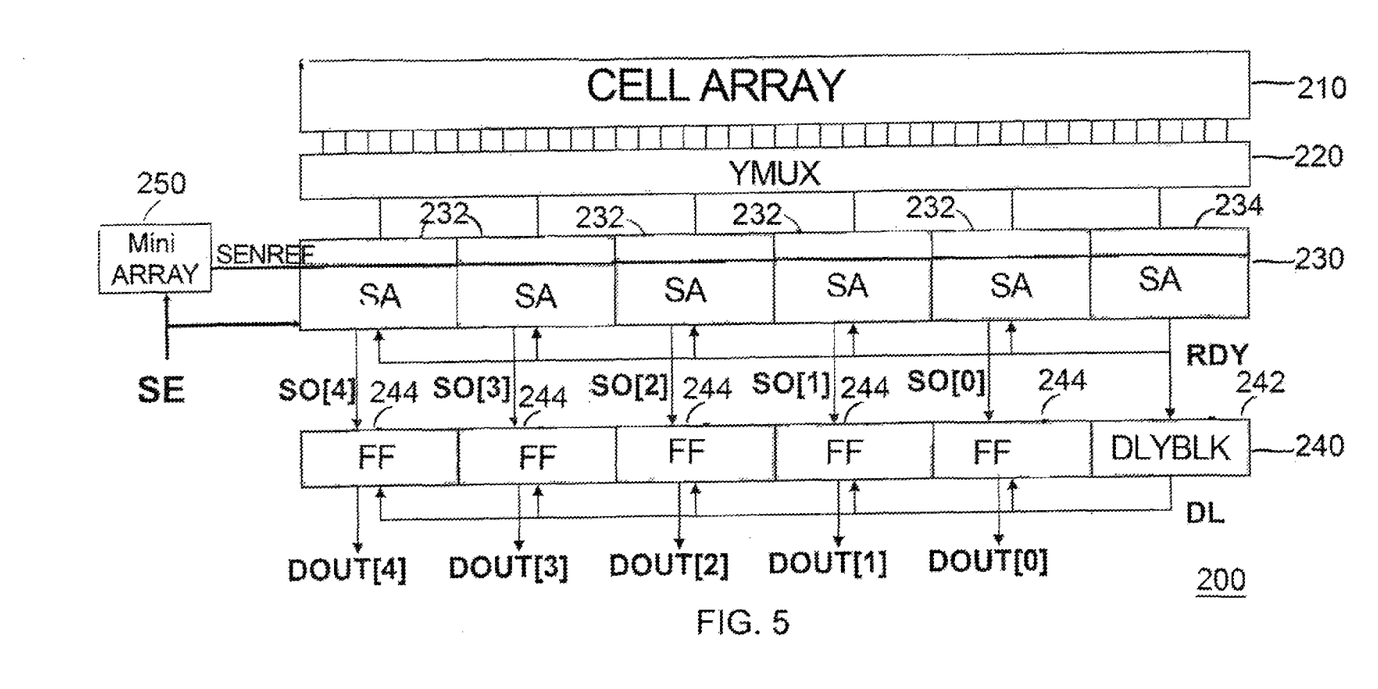
FIG. 5 is a block diagram of an embodiment of a memory system.
Figure 5A:
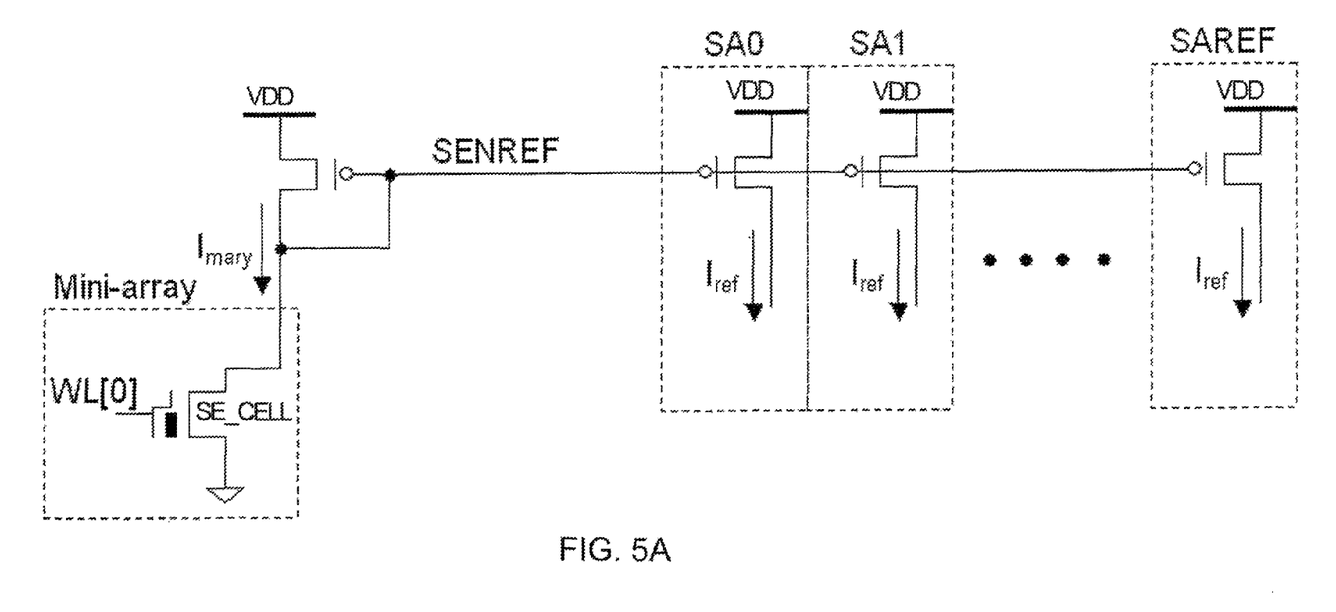
FIG. 5A illustrates a current mirror configuration for providing a reference current.

FIG. 5 is a schematic illustration of the basic memory read architecture 200 employing the circuits 100 and 100A discussed above. The memory read architecture includes a memory cell array 210, a bit line selection block 220 responsive to an address signal YADDR for selecting a bit line for sensing, a bank of sense amplifiers 230, and an output buffer 240 comprising a bank of data latches (e.g., flip flops 244) coupled to the bank of sense amplifiers 230. Control signal SE enables the read function. As discussed above, control signal RDY is provided by the reference sense amplifier circuit 234 and represents the completion of a read of a highly-erased memory cell. Signal SENREF is the signal for $I_{ref}$ to mirror the current in the mini array 250. The current mirror connection between mini array 250 and the sense amplifiers is schematically illustrated in FIG. 5A. Current $I_{ref}$ mirrors current $I_{mary}$ as follows: $I_{ref}=I_{mary}*SR$, where SR is the ratio of the current mirror. As should be understood by those of ordinary skill in the art, SR is determined by considering the read speed.

Signal DL is a delayed version of signal RDY provided by delay block 242 of output buffer 240. The delay block 242 is essential even in conventional architectures for covering the erase current distribution. The data outputs from flip flop data latches 244 are labeled DOUT. There are several nanoseconds to sense data SO before delayed latching of SO by the flip flips 244.

With reference to the bank of sense amplifiers 230, the bank includes sense amplifiers SA 232 constructed in accordance with circuit 100 of FIG. 3 and a reference sense amplifier 234 constructed in accordance with circuit 100A of FIG. 4. Sense amplifiers SA 232 provide sense output SO and reference sense amplifier 234 provides control signal RDY.

The operation of the circuits of FIGS. 3 and 4 and the read architecture of FIG. 5 in reading data from memory is now described in connection with FIG. 6. Specifically, FIG. 6 is a timing diagram showing the timing of signals SE, PCH, ENJSA, SENREF, KEEPJ, CMP, RDY, PSO and SO.

As should be understood, the bit line needs to be discharged after every read in order to avoid the repeated read of a logical "0". The repetition in reading "0" will cause the accumulation of charge in the sensing node and the failure to read a logical "1" after repeated reads of a logical "0". When SE is asserted (time t1), the bit line discharge path (i.e., NMOS MN2) is off The bit line starts to charge, meaning the voltage at the sensing point CMP (i.e., node A in FIG. 3) starts to increase. When the voltage Vcmp at this sensing point reaches the threshold of the inverter 132 of the precharge level detector 130 (i.e., Vc) (time t2), PCH goes low, which turns off the precharge circuit 140 and enables the keeper circuit 160 to charge or discharge CMP. Initially, the voltage Vcmp is raised from Vc to the keeper voltage Vk (at time t3), which is above the trigger voltage of the inverter 122 of the sense output circuit 120 (i.e., Vs) and kept at the keeper voltage Vk while waiting for the reference current from the mini-array 250 to be generated. Voltage Vk is set above the trigger voltage Vs because setting it equal to the trigger voltage may result in errors in reading a weakly-programmed cell because the cell current of a weakly-programmed cell may still pull down the sensing node slightly. This switches SENREF from high to a suitable voltage which is generated from the current mirror of the mini-array (time t4), and indicates that the comparison between the reference current $I_{ref}$, which is the mirrored current from the mini array 250, and the memory cell current $I_{cell}$ is going to start and that the keeper circuit 160 needs to be switched off, which occurs at time t5. If the sense amplifier SA reads an erased cell (i.e., logic 1), Vcmp will begin to go down to VSS (time t6). Of course, if the cell is not erased, Vcmp would go up from Vk. At the beginning of this sense operation, Vcmp may be close to the sensing voltage Vs but no current $I_s$ is flowing in the sensing inverter 122 because the sensing inverter 122 is off while waiting for signal RDY to be asserted, which occurs at time t7. RDY comes from the reference sense amplifier of the circuit 100A after a strongly-erased reference memory cell is read. After RDY is asserted, the sensing inverter 122 is enabled and the data can be delivered rapidly (at time t8).

Figure 6:
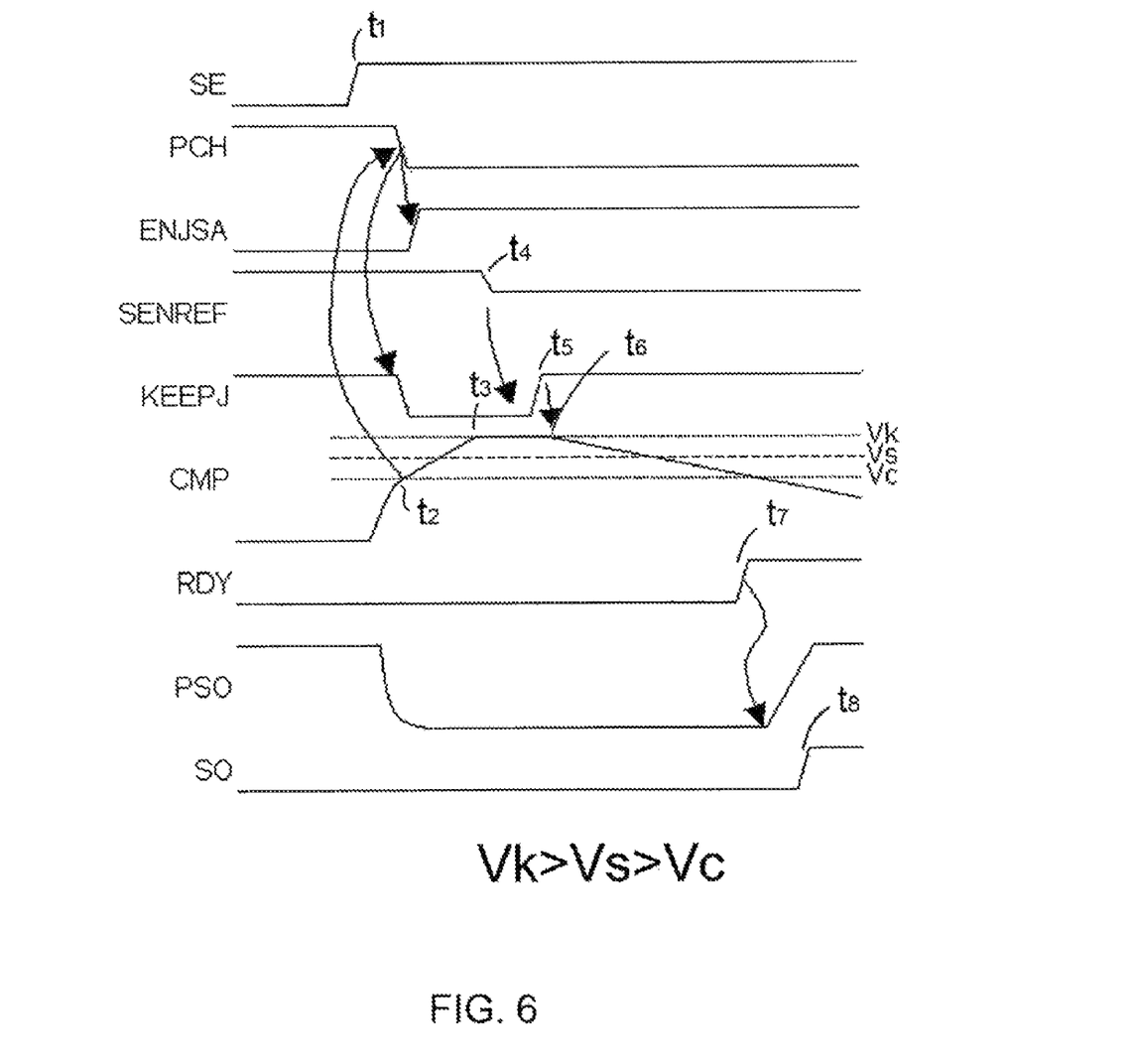
FIG. 6 is a timing diagram illustrating the operation of the memory circuit of FIG. 3.

As illustrated in FIG. 6, the delay in turning on the sensing inverter 122 ensured that the voltage at CMP was well below Vs when the sensing inverter 122 was activated. This minimizes the crowbar current in the sensing inverter 122.

As also illustrated in FIG. 6, the keeper circuit 160 keeps the bit line voltage Vcmp higher than Vs without over or under precharge concerns. Setting keeper voltage Vk higher than Vs optimize the access time for reading erased cells and avoid errors in reading these erased cells (i.e., in reading logical '1's). Voltage Vk and Vs can be selected using simulation and memory cell modeling. By way of example only, in a 0.18 µm embedded flash process, Vk may be set to 0.74V, Vs to 0.70V and Vc to 0.69V. These values, however, change with the process corner.

As detailed herein, the read architecture offers a number of improvements over conventional read architectures. First, the sense output circuit is kept off via control signal RDY until it is known that bit line voltage is sufficiently above or below the sense voltage Vs. This delay in activating the sense output circuit minimizes the crow bar current through the sense inverter of the sense output circuit, saves significant power and avoids errors in data reads of erased cells, which can occur when the sense operation begins with the bit line voltage too close to the sense threshold.

Second, the pre-charge level detector and sense output circuits are separated from one another. That is, the output control signal PCH of the pre-charge level detector is not dependent on the output of the sense output circuit. This avoids unintentional bit line overcharges. With conventional circuits, the sense output is used to control the precharge control signal. This is not the case with embodiments of the pre-charge level detector.

Third, the memory read architecture employs a keeper circuit whose purpose is to maintain the bit line voltage at a level above the sense threshold voltage until the reference current from the mini array is ready. Specifically, the precharge level detector detects when the bit line has reached a precharge level, but due to the large capacitance of the bit line, the reference current is not ready as quickly. So, after the precharge level is reached, there is a period before $I_{reff}$ is ready. With prior art architectures, the bit line voltage can decay and may be lower than the precharge level when $I_{reff}$ is ready. Using the keeper circuit, the voltage is maintained until the reference current is available.

In embodiments, a sense amplifier circuit, includes: a precharge circuit configured to precharge a bit line coupled to a sensing node in response to a precharge control signal; and a sense output circuit, the sense output circuit comprising a sense output inverter coupled to the sensing node, wherein the sense output inverter is disabled during bit line precharging and for a period after bit line precharging is complete, and thereafter the sense output inverter is enabled.

In other embodiments, a sense amplifier circuit includes: a sense output circuit, the sense output circuit comprising a sense output inverter coupled to a sensing node; a precharge circuit configured to precharge a bit line coupled to a sensing node in response to a precharge control signal; a precharge level detector circuit for providing the precharge control signal, the precharge level detector circuit including a precharge level detector circuit inverter coupled to the sensing node and having a trigger point voltage less than a trigger point voltage of the sense output inverter, wherein the precharge level detector triggers the precharge circuit via the precharge control signal to stop charging the bit line when a voltage at the sensing node exceeds the trigger point of the precharge level detector circuit inverter; and a keeper circuit coupled to the sensing node for maintaining for a period of time, after the precharge circuit stops charging the bit line, a voltage of the sensing node at a constant voltage.

An embodiment of a method of sense amplifying has also been described herein in connection with the description of the operation of various embodiments of the sense amplifier circuits. In one embodiment, the method includes the steps of A method of sense amplifying during a sense enable period, comprising the steps of: precharging a bit line coupled to a sensing node; disabling a sense output inverter coupled to the sensing node of a sense output circuit during bit line precharging and for a period of time thereafter; after precharging the bit line, maintaining a voltage of the sensing node at a constant voltage; detecting a control signal from a reference current generator circuit and in response to detecting the control signal, stop maintaining the voltage of the sensing node at the constant voltage; in response to the control signal from the reference current generator circuit, providing a reference current to the sensing node; after stopping maintaining the voltage of the sensing node at the constant voltage, detecting a control signal from a reference sense amplifier and in response to detecting the control signal from the reference sense amplifier enabling the sense output inverter; and detecting a data state of a memory cell coupled to the sensing node with the enabled sense output inverter.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A sense amplifier circuit, comprising:
   a precharge circuit configured to precharge a bit line coupled to a sensing node in response to a precharge control signal; and
   a sense output circuit, the sense output circuit comprising a sense output inverter coupled to the sensing node, wherein the sense output inverter is disabled during bit line precharging and for a period after bit line precharging is complete, and thereafter the sense output inverter is enabled.

2. The sense amplifier circuit of claim 1, wherein the sense output inverter is enabled in response to a control signal indicating a read is complete of a memory cell by a reference sense amplifier.

3. The sense amplifier circuit of claim 2, wherein the memory cell is a strongly-erased memory cell.

4. The sense amplifier circuit of claim 1, wherein the sense output circuit includes a switch circuit configured to enable the sense output circuit in response to a control signal.

5. The sense amplifier circuit of claim 4, wherein the switch comprises a header transistor coupled to the sense inverter and responsive to the control signal.

6. The sense amplifier circuit of claim 1, wherein the period after bit line precharging is complete is such that in the case of reading an erased memory cell by the sense amplifier circuit a voltage at the sensing node is substantially lower than a trigger voltage of the sense inverter, thereby minimizing crowbar current on the sensing inverter.

7. A sense amplifier circuit, comprising:
   a sense output circuit, the sense output circuit comprising a sense output inverter coupled to a sensing node;
   a precharge circuit configured to precharge a bit line coupled to a sensing node in response to a precharge control signal;
   a precharge level detector circuit for providing the precharge control signal, the precharge level detector circuit including a precharge level detector circuit inverter coupled to the sensing node and having a trigger point voltage less than a trigger point voltage of the sense output inverter, wherein the precharge level detector triggers the precharge circuit via the precharge control signal to stop charging the bit line when a voltage at the sensing node exceeds the trigger point of the precharge level detector circuit inverter; and a keeper circuit coupled to the sensing node for maintaining for a period of time, after the precharge circuit stops charging the bit line, a voltage of the sensing node at a constant voltage.

8. The sense amplifier circuit of claim 7, wherein the constant voltage is above the trigger point voltage of the sense output inverter.

9. The sense amplifier circuit of claim 8, wherein the keeper circuit includes a keeper circuit inverter having an output coupled to the sensing node, the keeper circuit inverter having an input coupled to the output of the inverter.

10. The sense amplifier circuit of claim 9, wherein the keeper circuit inverter is coupled to a switch circuit for enabling the keeper circuit, wherein the switch is responsive to a keeper control signal defining the period during which the keeper circuit maintains the voltage of the sensing node at the constant voltage.

11. The sense amplifier circuit of claim 10, wherein the keeper circuit comprises a circuit for providing the keeper control signal, the circuit for providing the keeper control signal including a NAND gate having an output corresponding to the keeper control signal, a first input coupled to an output of the precharge level detector circuit inverter, and a second input for receiving a control signal from a reference current generator circuit.

12. The sense amplifier circuit of claim 11,
wherein the first input of the NAND gate is coupled to the output of the precharge level detector circuit inverter through an inverter; and
wherein the control signal from the reference current generator circuit is coupled to the second input of the NAND gate through a pair of inverters, the pair of inverters coupled together at a node, the node having a capacitor coupled thereto.

13. The sense amplifier circuit of claim 7, wherein the keeper circuit is operational to maintain the constant voltage until a time when a reference current is provided to the sensing node for comparison with a memory cell current.

14. The sense amplifier circuit of claim 13, further comprising a reference circuit coupled to the sensing node for providing the reference current.

15. The sense amplifier circuit of claim 13, wherein the keeper circuit turns on in response to the precharge control signal and turns off in response to a control signal from a reference current generator circuit.

16. The sense amplifier circuit of claim 7, wherein the sense output inverter is disabled during bit line precharging and for a period after bit line precharging is complete, and thereafter the sense output inverter is enabled, the sense output inverter being enabled in response to a control signal indicating that sensing of a strongly-erased memory cell is complete.

17. The sense amplifier circuit of claim 7, wherein the precharge level detector circuit further comprises:
a second inverter coupled to an output of the precharge level detector circuit inverter;
a first NOR gate; and
a second NOR gate,
wherein the precharge control signal is provided at an output of the first NOR gate, the first NOR gate having a first input coupled to an output of the second inverter and a second input coupled to an output of the second NOR gate, the second NOR gate having a first input coupled to the output of the first NOR gate and a first input for receiving a sense enable control signal.

18. The sense amplifier circuit of claim 17, wherein the precharge level detector circuit further comprises a switch coupled to the precharge level detector circuit inverter for disabling the precharge level detector circuit inverter in response to the precharge control signal.

19. A method of sense amplifying during a sense enable period, comprising the steps of:
precharging a bit line coupled to a sensing node;
disabling a sense output inverter coupled to the sensing node of a sense output circuit during bit line precharging and for a period of time thereafter;
after precharging the bit line, maintaining a voltage of the sensing node at a constant voltage;
detecting a control signal from a reference current generator circuit and in response to detecting the control signal, stop maintaining the voltage of the sensing node at the constant voltage;
in response to the control signal from the reference current generator circuit, providing a reference current to the sensing node;
after stopping maintaining the voltage of the sensing node at the constant voltage, detecting a control signal from a reference sense amplifier and in response to detecting the control signal from the reference sense amplifier enabling the sense output inverter; and
detecting a data state of a memory cell coupled to the sensing node with the enabled sense output inverter.

20. The method of claim 19,
wherein the constant voltage is greater than a trigger voltage of the sense output circuit, and
wherein the precharging step includes the steps of:
detecting that a voltage of the sensing node reached a predetermined voltage level less than the trigger voltage of the sense output circuit; and
after detecting that the voltage of the sensing node has reached the predetermined voltage level, enabling a keeper circuit to perform the maintaining step.

* * * * *